United States Patent [19]

Bottomley et al.

[11] Patent Number: 4,521,733

[45] Date of Patent: Jun. 4, 1985

[54] NMR IMAGING OF THE TRANSVERSE RELAXATION TIME USING MULTIPLE SPIN ECHO SEQUENCES

[75] Inventors: Paul A. Bottomley, Clifton Park; William A. Edelstein, Schenectady, both of N.Y.

[73] Assignee: General Electric Company, Schenectady, N.Y.

[21] Appl. No.: 497,358

[22] Filed: May 23, 1983

[51] Int. Cl.³ ............................................. G01R 33/08
[52] U.S. Cl. ...................................... 324/309; 324/307
[58] Field of Search ................. 324/300, 307, 309, 311

[56] References Cited

U.S. PATENT DOCUMENTS

| | | | |
|---|---|---|---|
| 4,115,730 | 9/1978 | Mansfield | 324/309 |
| 4,318,043 | 3/1982 | Crooks | 324/309 |
| 4,431,968 | 2/1984 | Edelstein | 324/309 |

FOREIGN PATENT DOCUMENTS

| | | |
|---|---|---|
| 0074022 | 8/1982 | European Pat. Off. . |
| 0091008 | 3/1983 | European Pat. Off. . |
| 0088970 | 5/1983 | European Pat. Off. . |
| 0098426 | 6/1983 | European Pat. Off. . |

2052753 4/1980 United Kingdom .

Primary Examiner—Michael J. Tokar
Attorney, Agent, or Firm—Lawrence D. Cutter; James C. Davis, Jr.; Marvin Snyder

[57] ABSTRACT

Improved nuclear magnetic resonance (NMR) imaging methods based on a Carr-Purcell-Meiboom-Gill (CPMG) RF pulse sequence and pulsed magnetic field gradients applied to both multiple angle projection (MAP) imaging techniques, and to the two-dimensional Fourier transform (2DFT) or spin warp imaging techniques, are disclosed. The improved methods involve the generation of multiple spin echoes induced by a repetitive sequence of phase alternated 180° nonselective pulses, wherein the resulting spin echoes are used to provide substantive improvements in the pixel signal to noise ratio, and/or to generate images which reflect substantially the transverse relaxation time $T_2$. The improved imaging methods are particularly useful when directed to the detection and localization of various disease states of biological tissue, which exhibit altered $T_2$ relaxation times indicative of changes at the molecular level.

46 Claims, 12 Drawing Figures

NMR IMAGING OF THE TRANSVERSE RELAXATION TIME USING MULTIPLE SPIN ECHO SEQUENCES

BACKGROUND OF THE INVENTION

I. Field of the Invention

The present invention relates generally to nuclear magnetic resonance (NMR) imaging methods employing multiple spin echo pulse sequences together with either multiple angle projection methods or two-dimensional Fourier transform (2DFT), or spin warp, imaging methods. In particular, the imaging methods involve the generation of multiple spin echoes induced by a repetitive sequence of phase alternated 180° nonselective RF pulses. The multiple spin echo signals thus produced are used to improve the signal to noise ratio of the resulting NMR image, and/or advantageously to generate NMR images whose intensity reflects the transverse relaxation time $T_2$ parameter alone.

II. Description of the Prior Art

NMR imaging as a medical diagnostic tool offers a number of important advantages over various other means available for probing the human body. The most significant of these advantages result from the completely noninvasive nature of the echnology, and the ability to obtain spatially encoded specimen data with a good degree of precision. Additionally, NMR has minimal, if any, hazards for either patients or operators of the apparatus; and perhaps most importantly, NMR image intensities are increasingly being found to be sensitive to various disease states. Clinical studies now underway are noting that the NMR relaxation times of malignant tissues are in general longer than those of the tissues of origin. This property is apparently not unique to cancerous tissue, but rather is indicative of the changes in molecular level structure of water associated with certain disease states. Other pathologies detected by NMR imaging include hydrocephalis; infarcted tissue; edema; multiple sclerosis plaques; and liver cirrhosis.

Accordingly, reference is now made herein to a recent article titled "Nuclear Magnetic Resonance: Beyond Physical Imaging" by Paul A. Bottomley, IEEE Spectrum, Vol. 20, no. 2, pp 32-38 (1983). More complete treatments of basic NMR concepts are provided in a recent text edited by Leon Kaufman et al., entitled "Nuclear Magnetic Resonance Imaging and Medicine", Igaku-Shoin, New York and Tokyo (1981); and also in an earlier text by Thomas C. Farrar et al., entitled "Pulse and Fourier Transform NMR, An Introduction to Theory and Methods", Academic Press, New York (1971).

The terms NMR imaging and NMR zeugmatography apply to an increasing range of NMR methods wherein static magnetic fields (to produce polarization of nuclei) are combined with magnetic field gradients (to spatially encode the sample volume of interest) and with RF magnetic fields (to spatially reorient polarized nuclei) to provide pictures of the spatial distribution of various NMR properties. In the recent past, the technical and patent literature have burgeoned, and have reported results of successive advances of the field.

Generated NMR signals characteristically exhibit two distinct relaxation times: the longitudinal (or spin-lattice) relaxation time $T_1$, and the transverse (or spin-spin) relaxation time $T_2$. Both $T_1$ and $T_2$ fall in the range of about 0.04 to 3 seconds. Their measurement typically involves the application of either of two types of radio frequency (RF) magnetic field excitation pulses applied at the NMR frequency (the so-called Larmor frequency).

At equilibrium an ensemble of nuclear magnets generate a net nuclear magnetization M aligned with the direction of the applied static field $B_o$, the direction being arbitrarily designated the z-axis of a Cartesian coordinate system. A 90° RF pulse causes the magnetization M to depart 90° from the direction of the $B_o$ field into the x-y plane defined by the x-axis and y-axis, of the Cartesian coordinate system. Similarly, a 180° RF pulse causes the magnetization M to reverse direction by 180° from its original direction (from the positive z-axis direction to negative z-axis direction for example). Following the excitation of the nuclei with RF energy, the absorbed energy is re-radiated as an NMR signal as the nuclei return to equilibrium. The energy is emitted in the form of a RF magnetic field.

Two known methods of measuring $T_2$ are the single spin echo (SE) method which involves the application of a 90°:$\tau$:180° NMR RF pulse sequence wherein $\tau$ denotes a selectively variable delay, and the Carr-Purcell-Meiboom-Gill (CPMG) method, which involves the application of a 90°:$\tau$:180°:2$\tau$:180°:2$\tau$:180° ... NMR pulse sequence, with phase alternated 180° pulses. A number of imaging schemes utilize the single spin echo sequence for other reasons and thereby generate images whose intensities are dependent on $T_2$ and other parameters. The use of multiple 180° RF pulses has been suggested specifically for the echo-planar NMR imaging method of P. Mansfield (see P. Mansfield et al. J. Magn. Reson., 29, 355, 1978). However, the approach of Mansfield et al. applies to a different NMR imaging sequence than disclosed herein, and is not for the purpose of improving the signal to noise ratio, nor for performing imaging of the $T_2$ parameter explicitly, and is thus not deemed to perform the same function as the method described herein.

For medical applications of NMR imaging it is desirable to increase signal to noise ratio, shorten imaging time, enhance spatial resolution and image the transverse and/or longitudinal relaxation times, in order to increase the amount of useful information gained from NMR studies performed on each patient.

The present invention teaches the use of new NMR imaging pulse sequences based on improvements related to previously known sequences, which sequences are specifically directed to producing either a substantial improvement in the heretofore available signal to noise ratio, or to producing an image responsive largely to the transverse relaxation time $T_2$, or both.

SUMMARY OF THE INVENTION

It is a primary object of the present invention to provide improved methods of NMR imaging involving the generation of multiple spin echoes induced by a repetitive sequence of phase alternated 180° pulses combined with pulsed magnetic field gradients.

Another object of the present invention is to provide improved methods of NMR imaging through the use of multiple spin echoes induced by a repetitive sequence of phase alternated 180° pulses, in combination with spatial differentiation by means of multiple angle projection, or by means of two-dimensional Fourier transform/spin warp imaging methods.

Yet another object of the present invention is to provide improved methods of NMR imaging via the use of NMR pulse sequences and related signal handling methods which enhance the signal to noise ratio of each pixel in the resulting images.

A still further object of the present invention is to provide improved methods of NMR imaging through the use of NMR pulse sequences and related signal handling methods which produce a resulting NMR image which is substantially a two-dimensional map of the transverse relaxation time parameter $T_2$ throughout one or more selected plane of the specimen being imaged.

In summary, the present invention provides improved methods of NMR imaging using pulse sequences which either produce an image with a higher signal to noise ratio; or improved imaging of the $T_2$ parameter; or an improved $T_2$ image which has a higher signal to noise ratio.

The transverse relaxation time $T_2$ is a measure of molecular level motion. Like the longitudinal relaxation time $T_1$, it differs for different biological tissue types, and is in fact generally elevated in cancerous and pathological tissues relative to normal tissues. It is therefore desirable to image $T_2$ in a manner which would produce a noninvasive diagnostic tool. In order to image $T_2$ it is necessary to combine an NMR imaging pulse sequence with a $T_2$ responsive sequence.

The present invention describes new NMR imaging sequences based on suitable modifications of the inventive sequences described in a co-pending application assigned to the same assignee as the present invention, and bearing Ser. No. 345,444 filed on Feb. 3, 1982 titled "Method of NMR Imaging which Overcomes $T_2^*$ Effects in an Inhomogeneous Static Magnetic Field".) The imaging sequences of the present invention involve, in part, incorporation of the CPMG pulse method which includes application of a $90°:\tau:180°:2\tau:180°:2\tau:180°$ ... RF pulse sequence with a selective excitation 90° pulse and phase alternated 180° pulses. The sequences are combined with the multiple angle projection (MAP) imaging method and also with the two-dimensional Fourier transform (2DFT), or spin warp, imaging method. The resultant imaging data are then used either to improve the signal to noise ratio of the images, and/or to obtain an image whose intensity reflects the $T_2$ parameter alone.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof may best be understood by reference to the following description taken in connection with the accompanying drawings in which:

FIGS. 8a, 8b and 8c illustrate a method for deriving a transverse relaxation time $T_2$ array suitable for producing a $T_2$ display using the NMR pulse sequences of the present invention.

DETAILED DESCRIPTION OF THE PREFERRED EMBODIMENTS

Prior to a description of the improved NMR imaging methods employed to practice the present invention, it is instructive to consider the various stages of the imaging process. The four primary stages are: sample excitation; spatial differentiation; signal reception and processing; and image reconstruction. Major emphasis is placed herein on the first three of these stages during which the novel features of the present invention are most relevant. It is also useful at this point to provide a brief overview of the basic NMR methods of selective excitation, multiple angle projection, and spin warp imaging, modified versions of which are advantageously employed in the preferred embodiments of the present invention.

Figure 1:
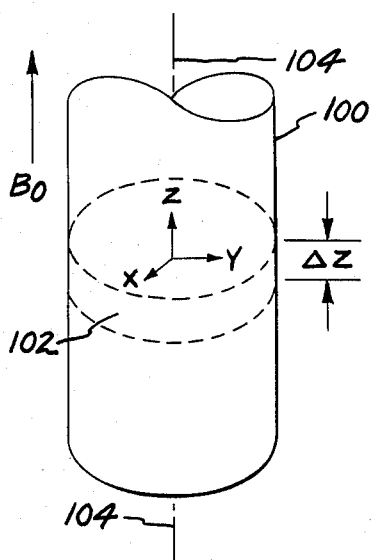
FIG. 1 is illustrates a sample situated in a static magnetic field and having a thin planar volume defined therein by selective excitation.
Figure 2:
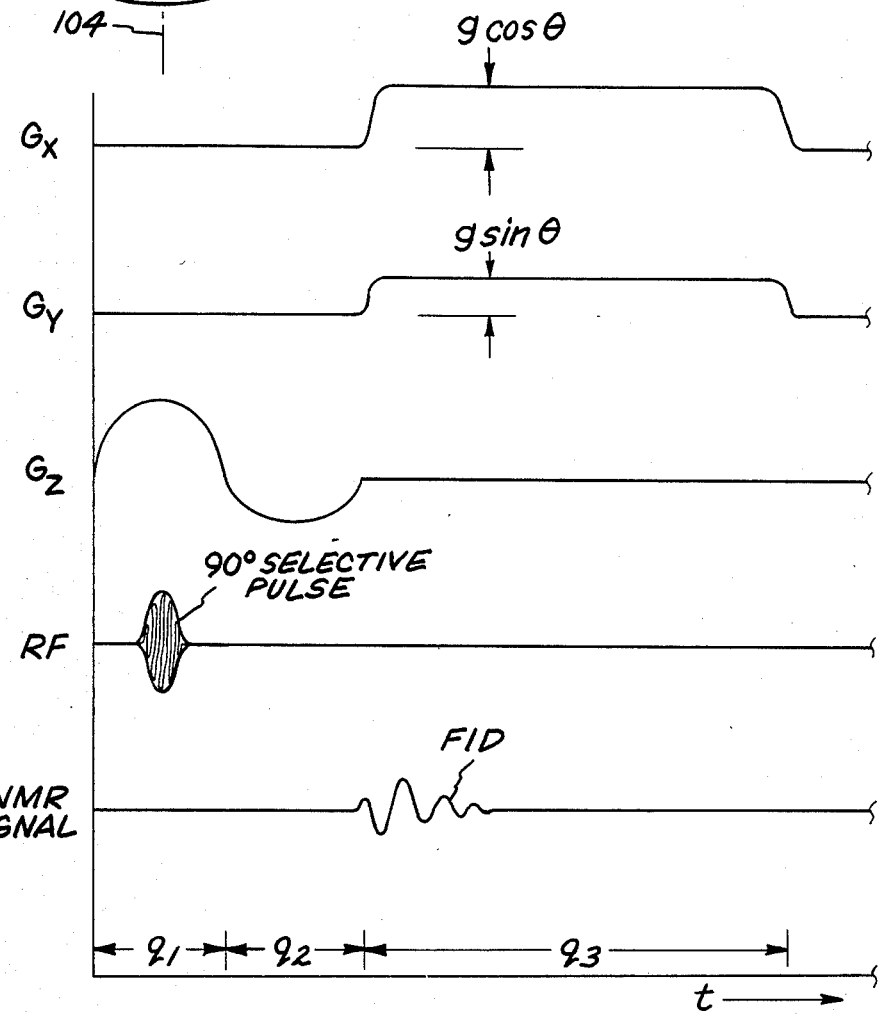
FIG. 2 depicts a conventional NMR pulse sequence used in multiple angle projection reconstruction imaging methods.

Basic pulse sequences for NMR imaging by multiple angle projection reconstruction methods are described with reference to FIGS. 1, 2 and 3. FIG. 1 depicts sample 100 positioned in a static homogeneous magnetic field $B_o$ directed in the positive z-axis direction of a conventional Cartesian coordinate system. The z-axis is conventionally selected to be coincident with cylindrical axis 104 of sample 100. The origin of the coordinate system is taken to be the center of sample 100, which is also at the center of thin planar slab 102 also referred to herein as imaging volume $\Delta Z$. Constant magnetic field $B_o$ is applied during the entire NMR process and accordingly is omitted from all of the figures depicting NMR pulse sequences to facilitate comprehension of the concepts described.

To produce spatial localization of the NMR signal, it is necessary to apply gradient magnetic fields in addition to the main magnetic field $B_o$. Typically, three such gradients are employed:

$$G_x(t) = \partial B_o / \partial x$$

$$G_y(t) = \partial B_o / \partial y$$

$$G_z(t) = \partial B_o / \partial z$$

The $G_x$, $G_y$, and $G_z$ gradients are constant throughout the imaging volume $\Delta Z$, (FIG. 1), but their magnitudes are typically time dependent. The magnetic fields associated with the gradients are denoted, respectively, $b_x$, $b_y$, and $b_z$, wherein $$b_x = G_x(t)x$$

$$b_y = G_y(t)y$$

$$b_z = G_z(t)z$$

within the imaging volume. The RF magnetic field pulses are applied in the x-y plane; e.g., along the x-axis. In the imaging sequences depicted in FIGS. 2 and 3, it is required that the NMR data collecting process be localized to a thin planar slab $\Delta Z$, termed the imaging plane. A thin planar slab, of resonant nuclei perpendicular to the z-axis is excited by the well known selective excitation method. Briefly, a 90° selective RF pulse is applied during period $q_1$ in the presence of a positive gradient $G_z$. The RF pulse contains a limited band of frequencies selected to excite nuclear spins only in the thin planar slab, $\Delta Z$ (FIG. 1), of object 100 in which the magnetic field strength in the presence of $G_z$ satisfies the resonance condition. The selective RF pulse could, for example, be in the form of a Gaussian amplitude modulated RF carrier, as shown, in which case the thin planar region $\Delta Z$ of FIG. 1 has a Gaussian shaped spatial profile along the z direction. The RF pulse could also take the form of a carrier modulated by (sin bt)/bt = sinc(bt) in which t is time and b is a constant. In the latter case, the thickness profile of the selected slab is approximately rectangular. In interval $q_2$, a negative $G_z$ lobe is applied to rephase the spins excited in interval $q_1$. The positive and negative $G_z$ gradients are selected so that the following relationship is at least approximately true:

$$\int_{q_1} G_z(t)dt = -\tfrac{1}{2} \int_{q_2} G_z(t)dt$$

in which $$\int_{q_1}$$

is the integral of the waveform of gradient $G_z$ over interval $q_1$ and $$\int_{q_2}$$

is the integral of the waveform of gradient $G_z$ over interval $q_2$.

In interval $q_3$ dephasing gradients $G_x$ and $G_y$ are applied in the x and y coordinate directions, respectively. For the embodiment of FIG. 2, the data are collected during interval $q_3$ by observing the free induction decay (FID) signal, in the presence of simultaneously applied imaging gradients $G_x$ and $G_y$ directed in the x and y axis directions, respectively. The amplitudes of imaging gradients $G_x$ and $G_y$ are constant during any one interval $q_3$, but vary as $g \cos \theta$ and $g \sin \theta$ respectively between successive applications of the entire sequence, where g is constant and $\theta$ is advanced linearly to cover a range of at least 180°. The Fourier transform of each data set acquired during $q_3$ for a particular angle $\theta_i$ is a one-dimensional projection of the NMR signal distribution along a ray oriented at $\theta_i$. The planar image is reconstructed from the angular projections using reconstruction algorithms such as are used in x-ray computed tomography.

Figure 3:
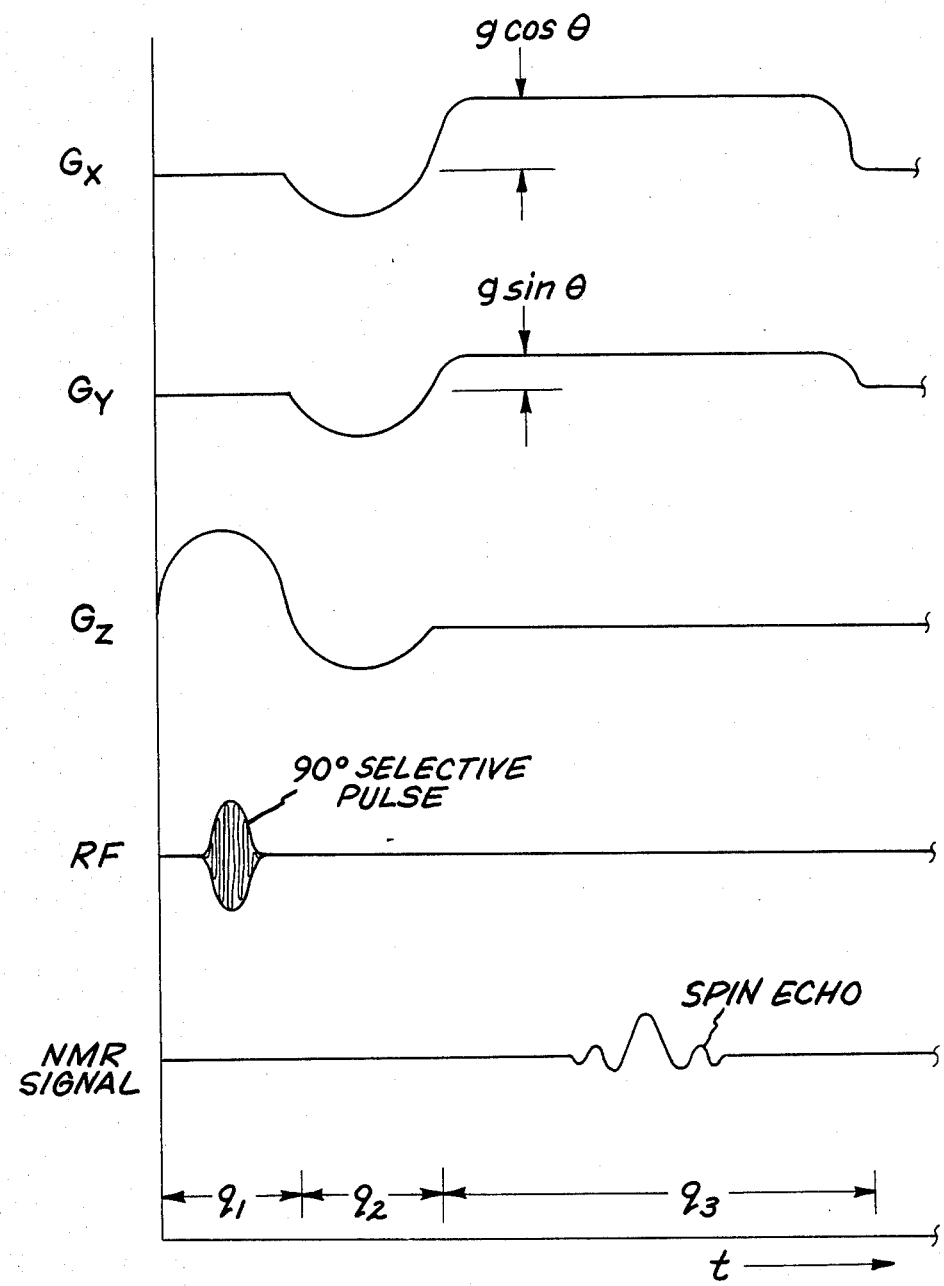
FIG. 3 depicts an alternative conventional NMR pulse sequence used in multiple angle projection reconstruction in which negative dephasing gradients in the x and y directions are applied to produce a spin echo.

An alternative method is to apply negative $G_x$ and $G_y$ gradients during period $q_2$, as shown in FIG. 3, to delay the FID signal and to obtain a form of spin echo. The effect of the negative $G_x$ and $G_y$ gradient pulses is to dephase the spins. The positive $G_x$ and $G_y$ imaging gradients, which have amplitudes related to $g \sin \theta$ and $g \cos \theta$, reverse the direction of the spin dephasing, so that the spins again rephase and produce an echo signal which can be observed in period $q_3$ where the resulting radial gradient is constant. However, deleterious dephasing effects due to inherent inhomogeneities in the $B_o$ field are not reversed by means of this pulse sequence.

Figure 4:
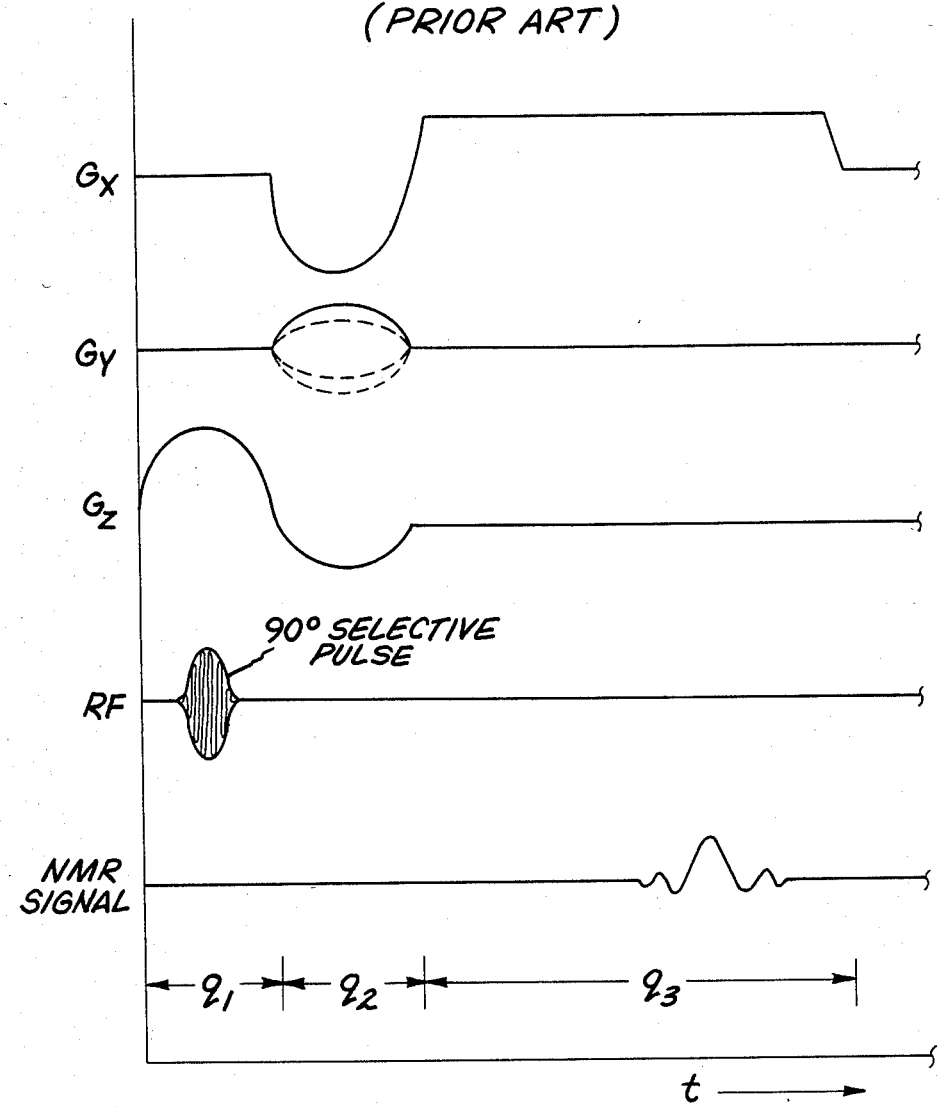
FIG. 4 depicts a conventional NMR pulse sequence used in spin warp imaging methods.
Figure 5A:
FIG. 5a schematically illustrates a column of spins aligned in the y direction in the planar volume depicted in FIG. 1.
Figure 5B:
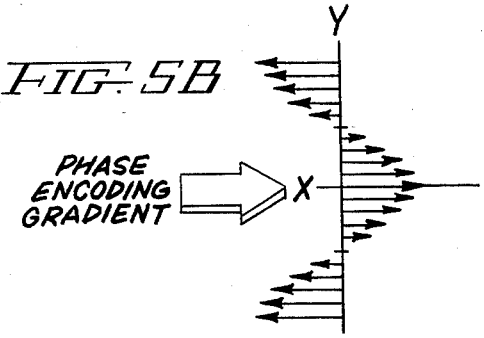
FIG. 5b schematically illustrates the phase changes in the arrangement of FIG. 5a, resulting from the application of a phase encoding gradient.

Reference is now made to FIGS. 4, 5A and 5B which illustrate the spin-warp NMR pulse sequence which may also advantageously be used with the improved imaging method of the present invention. As above, a thin planar slab of spins lying orthogonal to the z-axis is selected by the 90° selective excitation scheme previously described, and the spins are flipped 90° into the transverse x-y plane as previously described. Following the 90° RF pulse, a negative $G_z$ gradient is applied to rephase the spins as before. During time $q_2$, a negative $G_x$ gradient magnetic field can also be applied to delay the occurrence of the NMR signal.

A phase encoded, programmable amplitude gradient $G_y$ in the y-axis direction is used during interval $q_2$ to encode phase information by introducing a twist in the spins along the y-axis direction. FIG. 5a shows the profile of y-axis spins before the application of the phase encoding gradient. Following the application of a first $G_y$ gradient, the spins are twisted into a one turn helix as shown in FIG. 5b. The spatial information encoded by the different phases of the spins is read out by the application, during interval $q_3$, of a $G_x$ gradient which causes spins at different x positions to precess at different frequencies, enabling the separation of signals along the x direction according to frequency content of the received NMR signal. This is essentially a projection of the spin information onto the x-axis. The entire pulse sequence is repeated for each projection by applying different predetermined values of $G_y$ which twist the spins into different multiple-turned helices. Each projection contains different information because of the different $G_y$ phase encoding gradients used. This $G_y$ pulse amplitude change per projection is indicated in FIG. 4 by the dashed lines indicating sequential application of different $G_y$ encoding gradients. Upon completion of a full set of n, (say for example 180 projections) the complete planar image is reconstructed by a two-dimensional Fourier transformation algorithm operating on all NMR data from all projections. As in the aforedescribed multiple angle projection reconstruction imaging method, the negative lobe of the $G_x$ gradient does not reverse that dephasing of nuclear spins which is due to the inherent magnetic field inhomogeneities. Such inhomogeneities eventually result in an inevitable loss in NMR signal intensity.

Figure 6:
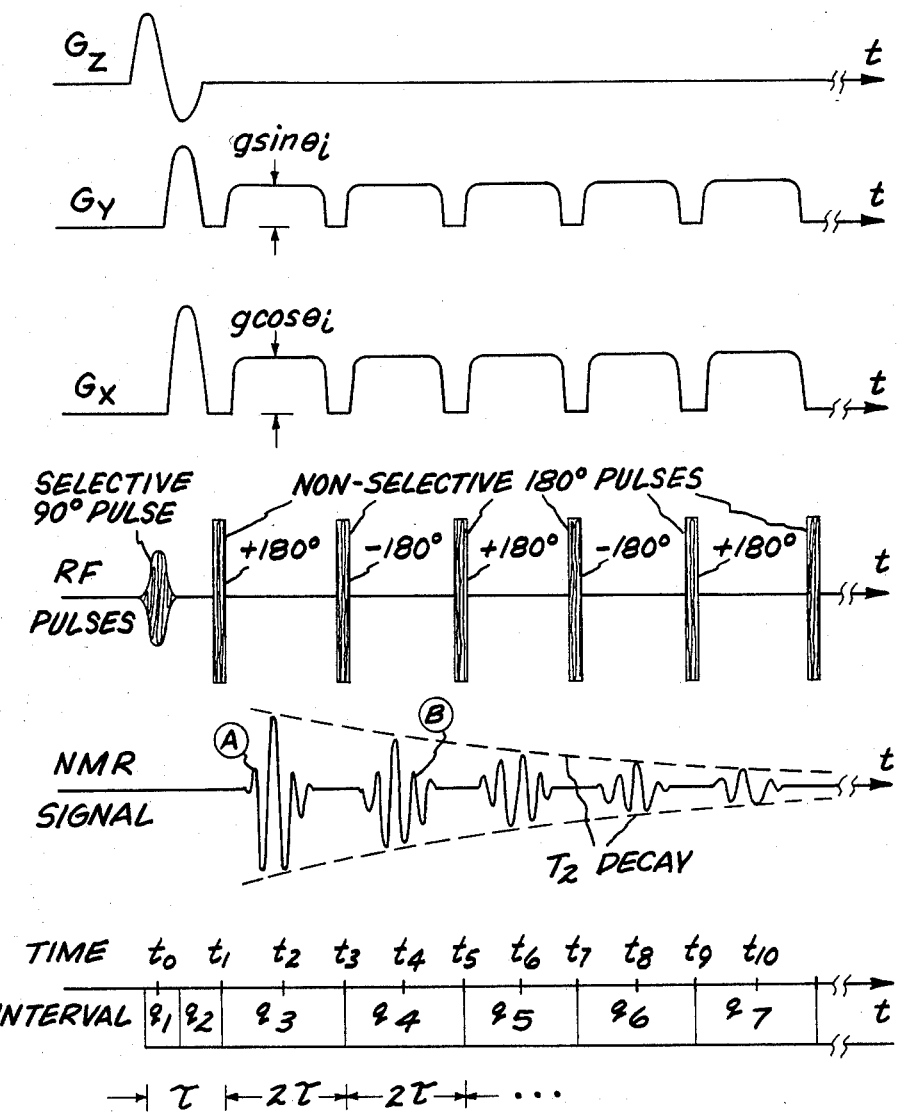
FIG. 6 illustrates a multiple spin echo, multiple angle projection imaging sequence according to the present invention.

Referring now to FIG. 6, there is shown a multiple angle projection imaging sequence using multiple spin echoes, in accordance with the present invention. The coordinate system discussed is identical to that described above in connection with FIG. 1. At time $t_0$, in time interval $q_1$ a 90° selective excitation RF pulse is applied to the sample of FIG. 1 in the presence of a z-axis gradient $G_z$ pulse, thereby selecting a thin slab $\Delta Z$ perpendicular to the z-axis. In the second interval $q_2$, a negative gradient $G_z$ lobe is applied to rephase spins in the usual manner. Additionally, dephasing gradient pulses $G_x$ and $G_y$ are also applied, as shown, during interval $q_2$. The amplitudes of these dephasing pulses are selected to be greater than, but proportional to $g \cos \theta_i$, where g is a constant for the entire image and $\theta$ is the angle of the $i^{th}$ projection. All of the gradients ($G_x$, $G_y$, and $G_z$) are then turned off and thereafter, at time $t_1$, a first +180° nonselective RF pulse is applied to initiate the generation of a first spin echo, (which exhibits a maximum at a later time $t_2$ as shown), and also to reverse the dephasing due to inhomogeneities in the static magnetic field $B_o$. In the third interval $q_3$ (which includes time $t_2$) following the first 180° pulse, imaging gradients $G_x$ and $G_y$ are applied and reach constant values of $g \cos \theta_i$ and $g \sin \theta_i$. These imaging gradients are adjusted such that:

$$\int_{q_2} G_x(t)dt = \int_{t_1}^{t_2} G_x(t)dt \qquad (1)$$

$$\int_{q_2} G_y(t)dt = \int_{t_1}^{t_2} G_y(t)dt$$

Thereafter, the first spin echo is observed centered at time $t_2$, where $t_1 - t_0 = t_2 - t_1$; i.e. the time from the 90° selective pulse to the first +180° nonselective pulse is selected to be equal to the time from the +180° nonselective pulse to the center of the first spin echo signal. This first spin echo is then recorded, illustratively, as a time series of digital values, by means of a high slew rate analog-to-digital converter (as discussed in connection with FIG. 8 hereinbelow) after the spin echo signal has been phase sensitive detected with respect to the center NMR frequency.

Just prior to time $t_3$ (where $t_3 - t_2 = t_2 - t_1$), the imaging gradients are again turned off and thereafter a second 180° pulse (phase shifted by 180°) is applied. The procedures of interval 3 are then repeated m times, where $2m\tau$ is of the order $2T_2$, thereby producing a total of m spin echoes, which are recorded as before. The $j^{th}$ spin echo in the sequence is centered at time $t_{2j}$, with the gradients adjusted such that:

$$\int_{t_{2j}}^{t_{2j+1}} G_x(t)dt = \int_{t_{2j+1}}^{t_{2j+2}} G_x(t)dt \qquad (2)$$

and similarily for the $G_y$ gradient.

The amplitudes of the successive spin echoes decay exponentially, with the time constant $T_2$ of the sample being imaged, according to the factor $\exp(-t/T_2)$. Except for the amplitude decay, the spin echoes have mirror image symmetry, or time reversal symmetry, about the intervening 180° pulses. The entire sequence is repeated at a period T seconds later for each new projection angle $\theta_{i+1}$, etc.

Figure 7:
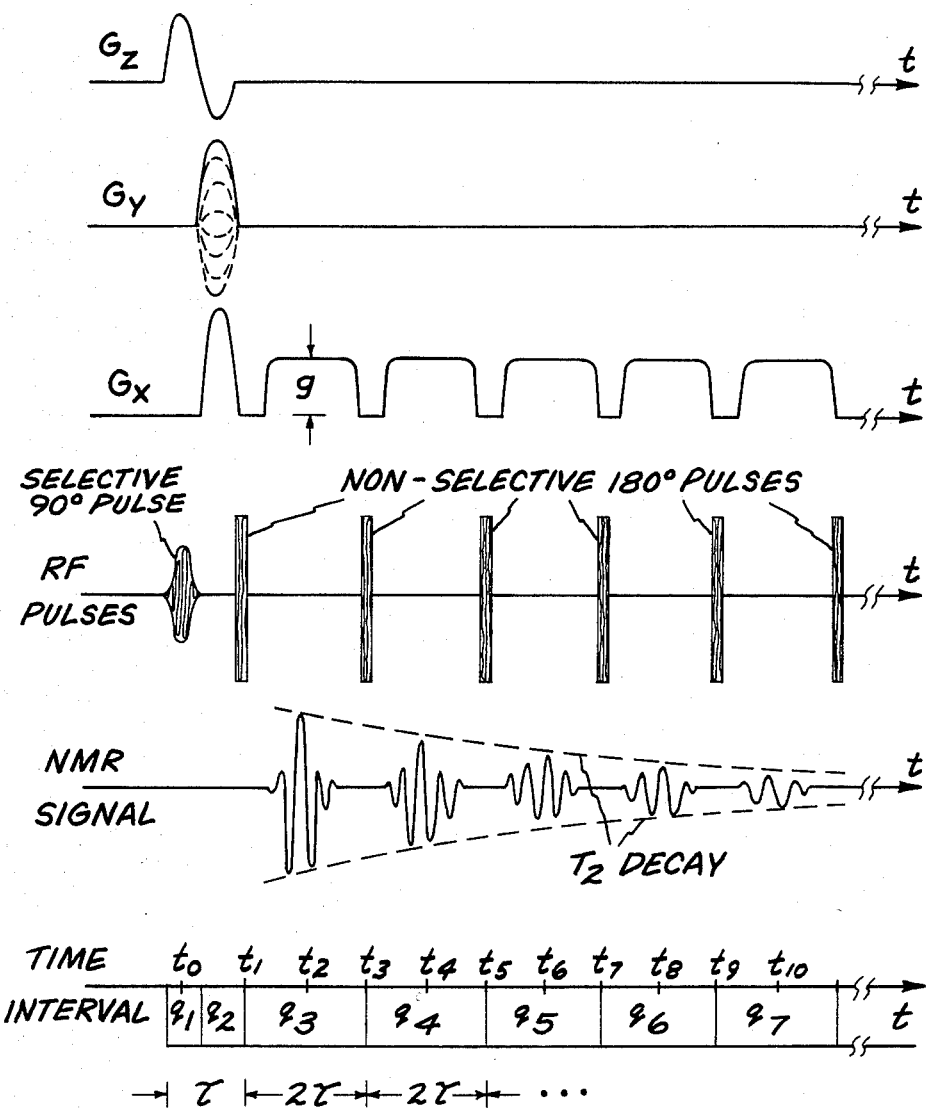
FIG. 7 illustrates a multiple spin echo, two-dimensional Fourier transform (2DFT) - spin warp imaging sequence according to the present invention.

Referring now to FIG. 7, there is shown a two-dimensional Fourier transform (2DFT) - spin warp sequence using multiple spin echoes. This pulse sequence is similar to that of FIG. 6, except that the $G_y$ gradient is a single programmable amplitude pulse applied in interval $q_2$. The amplitude of the $G_y$ pulse is incremented when each projection is repeated (i.e. subsequent repetitions of the entire sequence of FIG. 7), instead of rotating the projection angle. The constraints on the $G_x$ pulse sequence remain as specified in equations (1) and (2). The number of discrete values for the programmable amplitude $G_y$ gradient pulse are of the same order as the number of particular projection angles in the multiple angle projection sequence of FIG. 6. Illustratively, the multiple angle projection sequence may be repeated 180 times with $\theta_i$ being incremented 1° each time. Similarly, the programmable $G_y$ pulse requires approximately the same number of discrete values for the $G_y$ pulse amplitude for comparable spatial resolution of the sample into discrete pixels.

The spin echo data produced via the embodiments of FIGS. 6 and 7 may be treated in a number of ways to achieve the various objects of the present invention. Briefly, the data (i) may be averaged to improve the signal to noise ratio of an image in general; (ii) the data may be used to derive a $T_2$ image; and (iii) the data can be both averaged to improve signal to noise ratio, and further used to derive a $T_2$ image.

In order to obtain signal to noise ratio advantage, the m spin echoes (m equal to 8, for example) are first time reversed. This is done by reflecting the digitized even numbered spin echoes (the 2nd, 4th, etc.) in time to take into account the aforementioned mirror symmetry about the phase alternated 180° pulses. Thereafter, the m spin echoes are averaged together by combining corresponding temporal points on the various spin echoes. An illustrative pair of corresponding temporal points are shown as points (A) and (B) of FIG. 6. By proper signal data handling, the signal to noise ratio for each projection is improved by a factor given approximately by $$\left[ \sum_{j=1}^{m} e^{-\left(\frac{2Tj}{T_{2a}}\right)} \right]^{\frac{1}{2}} \qquad (3)$$

where $T_{2a}$ is an average $T_2$ of the sample and where $Y = (t_{2j+1} - t_{2j})$, An NMR image is reconstructed from the averaged data in the usual manner: a Fourier transform followed by application of the computer algorithms used for x-ray computed tomography are required if the data was obtained by the multiple angle projection sequence depicted in FIG. 6; two dimensional Fourier transformation yields the image from data acquired with the NMR imaging pulse sequence of FIG. 7.

To obtain an image which depicts only the $T_2$ parameter using the NMR data produced via the embodiments of FIGS. 6 and 7, the data must first be reflected in time as before. This produces the results that each spin echo in a particular projection is identical except for the exponential decay in amplitudes of each data point due to the effects of $T_2$. Consider that a first two-dimensional array of spin density (or intensity) values (a first stored image) is reconstructed (for an array of $180 \times 180$ pixels, for example) using only the first spin echo signal from each of the i projections. Thereafter, a second two-dimensional array (a second stored image) may similarly be reconstructed using only the second spin echo from each of the same i projections. Thus a series of such images can be reconstructed, one from each spin echo, and a $T_2$ image may be calculated therefrom relying on the presumed exponential decays of the image data (pixel for corresponding pixel) from one two-dimensional image to the next. The $T_2$ value per pixel is determined using a best fit curve between the two (or more) intensity values made available via the reconstructed arrays. If n>2, more than a single $T_2$ value for each pixel may be calculated, for example, due to the existance of free and bound nuclei at a particular pixel.

Figures 8A, 8B, 8C:
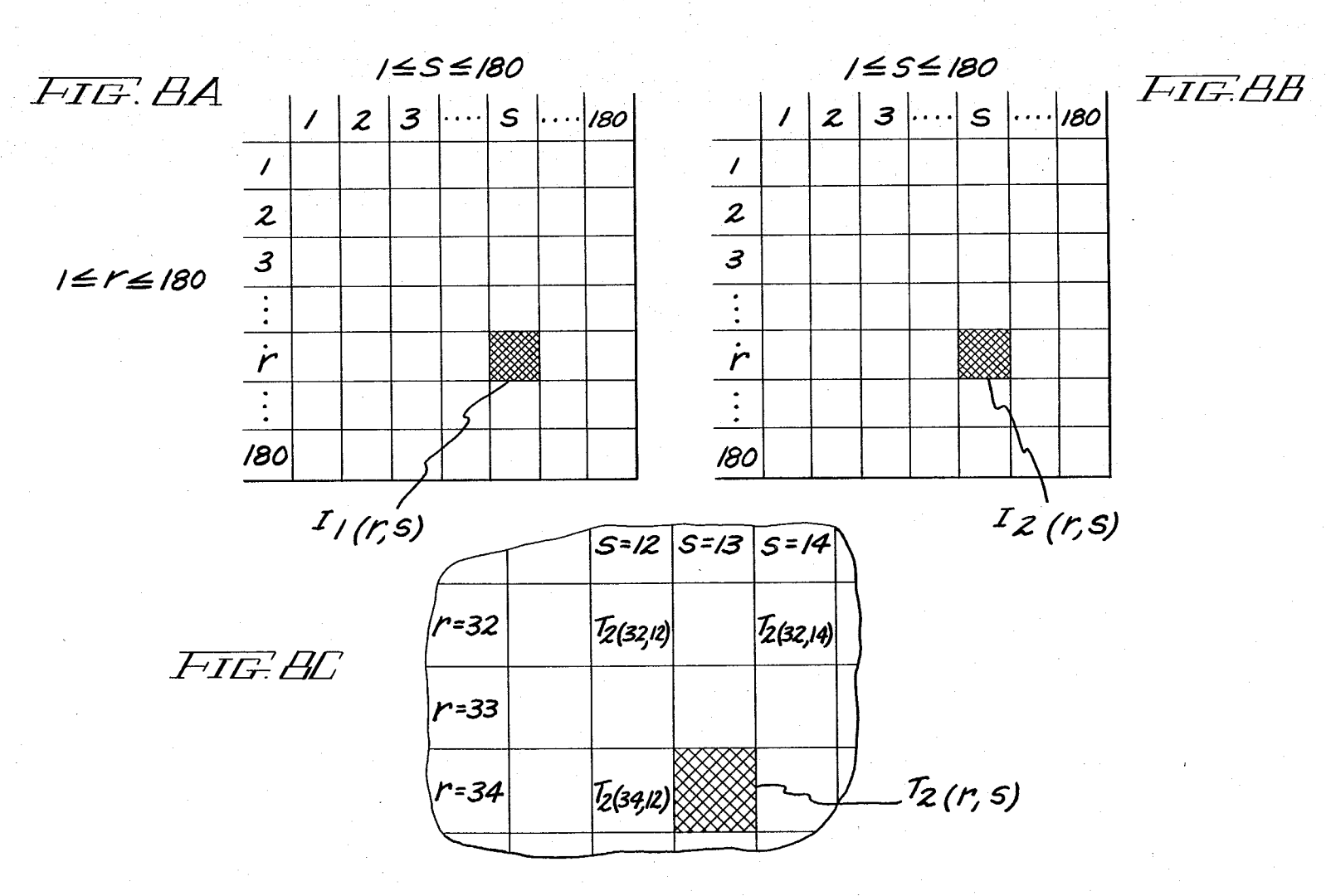

With reference to FIGS. 8a, 8b and 8c, the outline of the $T_2$ image reconstruction process is detailed. FIG. 8a shows an array of NMR signal intensity data representing an image consisting, for example, of a 180×180 pixel array. The image is reconstructed from one particular spin echo data generated by application of the sequences of either FIG. 6 or FIG. 7. If the FIG. 6 sequence is used, a Fourier transformation and application of the multiple angular projection reconstruction algorithm noted earlier is applicable. If the sequence of FIG. 7 is used, a 2-dimensional Fourier transform suffices to reconstruct the image. The 180×180 array (r=180 rows; s=180 columns) have as their individual intensities I(r,s), values derived from the n projections of the imaging plane corresponding to the selected slab ΔZ. Thus FIG. 8a may represent the pixel image intensities reconstructed using the first spin echo data in each echo sequence. A generalized pixel in any one of a series of images reconstructed from all of the different echoes of the projections may then be designated $I_j(r,s)$; the general image pixel for the first spin echo data is $I_1(r,s)$. FIG. 8b may represent the pixel image intensities reconstructed using the second spin echo data only, and its generalized pixel is designated $I_2(r,s)$. FIG. 8c represents a portion of the 180×180 pixel array containing $T_2$ data where the value for each $T_2$ pixel is calculated by a best fit curve from the corresponding intensity data $I_1(r,s)$ and $I_2(r,s)$. The generalized pixel for FIG. 8c is denoted $T_2(r,s)$. In symbolic terms for the $T_2$ pixel of row r and column s of FIG. 8c, calculated from images derived from two consecutive spin echo data sets, $$T_2(r,s) = 2\tau/[\ln(I_j(r,s)/I_{j+1}(r,s))] \qquad (4)$$

where j is the particular spin echo data used, and where $2\tau$ is the spacing between echoes. Other $T_2$ images may be obtained using various ones, or combinations of, particular spin echoes by replacing the $2\tau$ of Equation (4) with the correct spacing between the echoes. Optimum accuracy and/or signal-to-noise ratio of the $T_2$ NMR image is achieved when all of the echoes are used in the calculation. This is best achieved by performing a least square fit analysis for $T_2$ using the image data and the relation:

$$\ln [I(r,s)] = -\frac{t}{T_2(r,s)} + (\text{constant})$$

where t is the time following the 90° pulse of the sequence.

Additionally, the multiple spin echo data available via the embodiments of FIGS. 6 and 7 may be both averaged and then used to compute a second type of image which indicates the $T_2$ parameter only. To implement this approach, the spin echo data are reflected in time as previously detailed. Thereafter, the first m/2 spin echoes (for even m) are average (as detailed above by combining appropriate portions of time series of values) to produce a first averaged spin echo value. For example if m equals 8, the first four spin echoes are averaged together and an intensity array similar to that of FIG. 8a containing those averaged values is reconstructed. The second m/2 spin echoes are averaged to produce a second average spin echo value. For m equals 8, the fourth through eighth spin echoes are averaged together and an intensity array similar to that of FIG. 8b containing those second averaged values is constructed. As before, the two resulting arrays are processed using the method of Equation (4) with the correct value of the echo spacing ($8\tau$ in the example with m=8); an array of $T_2$ values analogous to that of FIG. 8c results. In this arrangement, the four averaged spin echoes obtain the benefit of a signal to noise ratio improvement as given by Equation (3), and the resulting array of derived $T_2$ values may be used to produce a two-dimensional map of information corresponding to the $T_2$ parameter alone. The two-dimensional $T_2$ data which results may then be displayed as an image on a cathode ray tube for study and analysis of the underlying biological or other significance of the sample being investigated.

Figure 9:
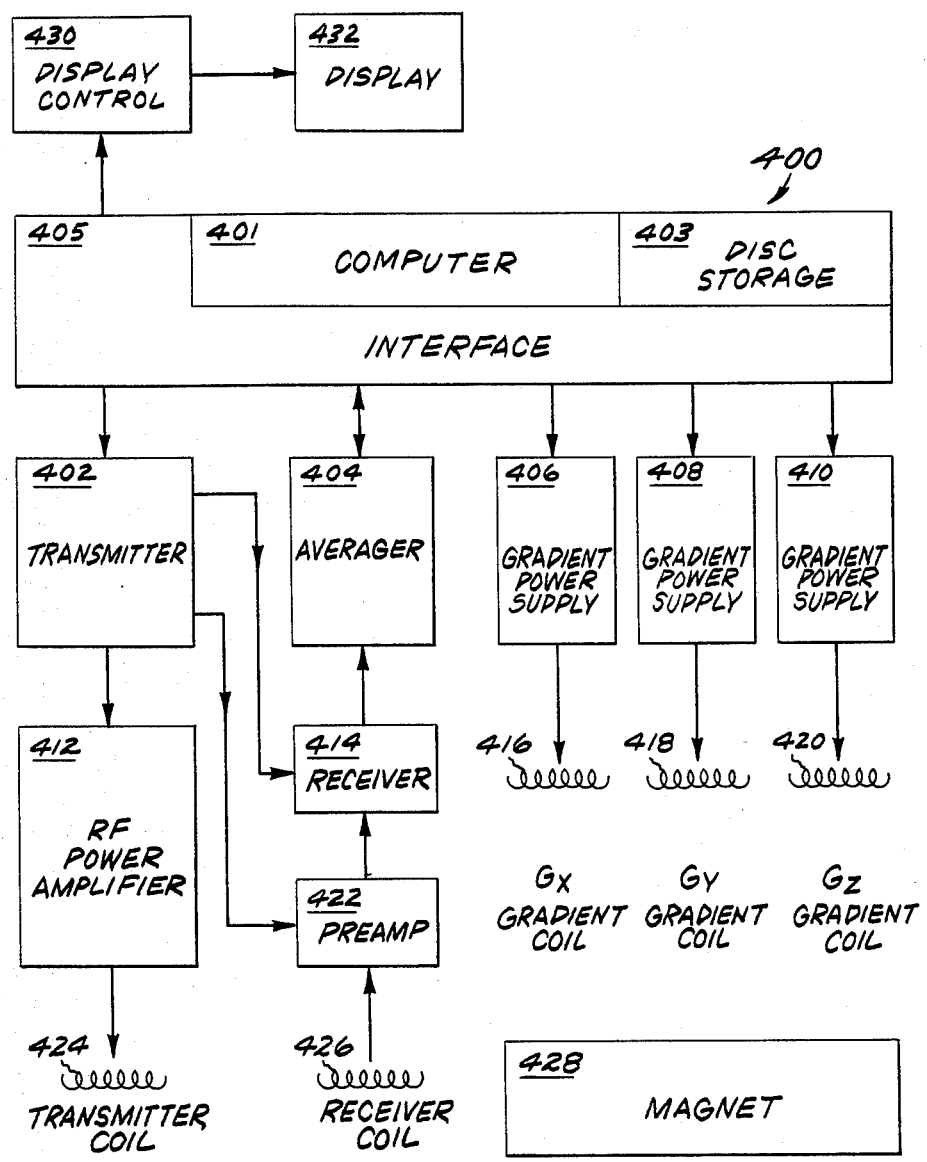
FIG. 9 is a simplified block diagram showing the major components of an NMR imaging apparatus suitable for implementing the pulse sequences and data handling needs of the present invention.

FIG. 9 is a simplified block diagram showing the major components of an NMR imaging apparatus suitable for implementing the pulse sequences and data handling needs of the present invention. The overall data handling system, generally designated 400, comprises general purpose computer 401 which is functionally coupled to disc storage unit 403, and interface unit 405. RF transmitter 402, signal averager 404, and gradient power supplies 406, 408, and 410 are coupled to computer 401 through interface unit 405. The three gradient power supplies are used for energizing, respectively, a set of x, y, and z gradient coils 416, 418 and 420.

The RF transmitter 402 is gated with pulse envelopes from computer 401 to generate RF pulses having the required modulation to excite resonance in the sample being imaged. The RF pulses are amplified in an RF power amplifier 412 to levels varying from 100 watts to several kilowatts, depending on the imaging method, and are applied to transmitter coil 424. Relatively high power levels are necessary for large sample volumes such as are encountered in whole body imaging, and where short duration pulses are required to excite large NMR frequency bandwidths.

The resulting NMR signal is sensed by receiver coil 426, amplified in low noise preamplifier 422, and thereafter routed to receiver 414 for further amplification, detection, and filtering. This NMR signal may then be digitized and averaged by signal averager 404, and routed to computer 401 for further processing. The processed signals are routed from computer 401 through interface 405 to display control unit 430 where they are stored, reformatted and applied to display unit 432. The display unit 432 may comprise CRT displays of the direct viewing storage tube (DVST) types, as well as conventional black and white or color television-like cathode ray tubes, which may include directly viewable calibration traces and the like.

Preamplifier 422 and receiver 414 are protected from the RF pulses during transmission by active disabling gating and/or by passive filtering. Computer 401 provides gating and envelope modulation for the NMR pulses, blanking for the preamplifier and RF power amplifier, and voltage waveforms for the gradient power supplies. Computer 401 also performs data processing such as Fourier transforms, image reconstruction, data filtering, image display, and storage functions, most of which are well known and do not form an intrinsic part of the present invention.

Transmitter and receiver RF coils may be configured as a single coil. Alternatively, two separate coils that are electrically orthogonal may be used. The latter configuration has the advantage of reduced RF pulse breakthrough into the receiver during pulse transmission. In both cases, the coils are orthogonal to the direction of the static magnetic field $B_o$ produced by magnet 428. The coils are isolated from the remainder of the system by enclosure in an RF shielded cage. Three typical RF coil designs are illustrated in the aforementioned copending application Ser. No. 345,444 filed Feb. 3, 1982 as FIGS. 11a, 11b, and 11c therein. All of the coils depicted therein produce RF magnetic fields in the x direction, and the coil designs illustrated in FIGS. 11b and 11c are suitable for magnetic geometries for which the axis of the sample chamber is parallel to the main field $B_o$ as shown in FIG. 1 of the instant specification. The coil design illustrated in FIG. 11a is applicable to geometries for which the sampler chamber axis is perpendicular to main field $B_o$.

Magnetic field gradient coils 416, 418 and 420 are necessary to provide the $G_x$, $G_y$ and $G_z$ gradient fields respectively. In the multiple angle projection reconstruction and spin-warp methods described above, the gradient fields should be monotonic and linear over the sample volume. Nonmonotonic gradient fields can cause a degradation in the NMR signal data, known as aliasing, which can lead to image artifacts. Nonlinear gradients can cause geometric distortions of the image. A design for gradient coils suitable for magnet geometries with a sample chamber axis parallel to the main field $B_o$ is depicted in FIGS. 12a and 12b (of Ser. No. 345,444). Each of the gradients $G_x$ and $G_y$ is produced by a set of coils such as the sets 300 and 302 depicted in FIG. 12a. The coil sets as illustrated in FIG. 12a of aforementioned application (Ser. No. 345,444 filed Feb. 3, 1982) produce gradient $G_x$. The coil sets for producing gradient $G_y$ are rotated 90° around the cylindrical axis (axis 104 of FIG. 1) of the sample chamber relative to the coil that produces the gradient $G_x$. The z gradient is generated by a coil pair such as coils 400 and 402 shown in FIG. 12b.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A method of generating NMR image data using multiple spin echo pulse sequences and multiple angle projections for producing images having an improved signal to noise ratio, comprising:
  (a) selectively exciting nuclear spins within a planar slab of a sample and then applying a series of 180° nonselective radio frequency pulses to said sample at spaced time intervals to produce a corresponding series of m spin echo signals in the intervals following said 180° pulses, each spin echo having an associated signal to noise ratio;
  (b) said selecting and applying steps being repeatedly performed for a succession of projections with distinct imaging magnetic field gradients being employed for each of said succession of projections;
  (c) converting each of said series of spin echo signals in step (a) into a time series of values and averaging temporally corresponding points of said time series to produce an average time series of values representative of all of said spin echoes whereby the signal to noise ratio of said signal is improved by a factor related to the square root of the number m of distinct spin echoes in said series of spin echo signals;
  (d) transforming said average time series of values, derived from said m spin echo signals, into frequency domain data representative of NMR spin density data for predetermined spatial projections through said sample, and storing said frequency domain data;
  (e) processing said stored frequency domain data from said succession of projections into data representative of nuclear spin density distribution within said planar slab.

2. The method of claim 1 wherein said series of 180° pulses are of alternating phase, and said converting step further includes selectively inverting the time sequence of alternating ones of said time series of values.

3. The method of claim 1 wherein said processed data is displayed in the form of changes in intensity or chrominance corresponding to said average of NMR spin density data.

4. The method of claim 1 wherein said selective excitation of said planar slab comprises application of a 90° RF pulse in the presence of a first imaging magnetic field gradient pulse directed substantially perpendicular to the plane of said slab.

5. The method of claim 4 wherein said selective excitation pulse comprises a gaussian shape modulated RF carrier at the NMR frequency.

6. The method of claim 4 wherein said selective excitation pulse comprises a sinc(bt) shape modulated RF carrier at the NMR frequency.

7. The method of claim 4 wherein said selective excitation is followed by application of a second imaging magnetic field gradient pulse directed opposite to said first imaging magnetic field gradient, for a duration sufficient to rephase previously dephased nuclear spins lying within said planar slab.

8. The method of claim 7 wherein a third imaging magnetic field gradient directed substantially orthogonally to said first magnetic field gradient and lying in the plane of said selected slab is applied as a series of pulses between application of said 90° pulse and said 180° pulses, and between successive 180° RF pulses.

9. The method of claim 8 wherein said third imaging magnetic field gradient is substantially constant with respect to time during production of said spin echo signals.

10. The method of claim 8 wherein the integrals with respect to time of said third imaging magnetic field gradient pulse during its application between said 90° and 180° RF pulses, and its application between the first 180° RF pulse and the midpoint of the time interval between the first and second 180° pulses are substantially the same.

11. The method of claim 10 wherein said projections are obtained by reorienting said third imaging magnetic field gradient within the plane of said selected slab so as to span at least an arc of 180°.

12. A method of generating NMR image data using multiple spin echo pulse sequences and multiple angle projection for producing images reflecting substantially the transverse relaxation parameter $T_2$ comprising:
  (a) selectively exciting nuclear spins within a planar slab of a sample and applying a series of 180° nonselective radio frequency pulses to said sample at spaced time intervals to produce a corresponding series of m spin echo signals in the intervals following said pulses;
(b) said selecting and applying steps being repeatedly performed for a succession of projections with distinct magnetic imaging gradients being employed for each of said succession of projections;
(c) converting at least one of said series of m spin echo signals into a first time series of values and at least one other of said series of m spin echo signals into a second time series of values;
(d) transforming said first and second time series respectively into first and second frequency domain data representative of NMR spin density data for the same predetermined spatial projections through said slab and storing said frequency domain data;
(e) reconstructing said first stored frequency domain data from successive projections into modified data representative of the first spin density data at particular locations in said slab and storing said modified data as individual elements of a first array corresponding to particular slab locations;
(f) reconstructing said second stored frequency domain data from successive projections into modified data representative of the second spin density data at particular locations in said slab and storing said modified data as individual elements of a second array corresponding to particular slab locations, wherein corresponding individual elements of said first and second orthogonal arrays relate to the same particular slab locations; and
(g) determining a transverse relaxation time value for each of said particular slab locations using at least said first and second spin density data, and storing the resulting $T_2$ values in an array of locations corresponding to particular slab locations.

13. The method of claim 12 wherein said series of 180° pulses are of alternating phase, and said converting step further includes reversing the time sequence of alternating ones of said first and second time series of values.

14. The method of claim 12 wherein said array of locations of $T_2$ values is presented on display means and configured to facilitate visual interpretation thereof as changes in intensity corresponding to said $T_2$ values.

15. The method of claim 12 wherein said array of locations of $T_2$ values is presented on display means and configured to facilitate visual interpretation thereof as changes in display chrominance corresponding to said $T_2$ values.

16. The method of claim 12 wherein said array of $T_2$ values is presented on display means and configured to facilitate visual interpretation thereof as arrays of particular alphanumeric symbols corresponding to said $T_2$ values.

17. The method of claim 12 wherein said selective excitation of said planar slab comprises application of a 90° RF pulse in the presence of a first imaging magnetic field gradient pulse directed substantially perpendicularly to the plane of said slab.

18. The method of claim 17 wherein said selective excitation pulse comprises a gaussian shape modulated RF carrier at the NMR frequency.

19. The method of claim 17 wherein said selective excitation pulse comprises a sinc(bt) shape modulated RF carrier at the NMR frequency.

20. The method of claims 12 wherein said selective excitation is followed by application of a second imaging magnetic field gradient pulse directed opposite to said first imaging magnetic field gradient, for a duration sufficient to rephase previously dephased nuclear spins lying within said planar slab.

21. The method of claim 20 wherein a third imaging magnetic field gradient directed substantially orthogonally to said first magnetic field gradient and lying in the plane of said selected slab is applied as a series of pulses between the application of said 90° pulse and said 180° RF pulses, and between successive 180° RF pulses.

22. The method of claim 21 wherein said third imaging magnetic field gradient is substantially constant with respect to time during production of said spin echo signals.

23. The method of claim 22 wherein the integral with respect to time of said third imaging magnetic field gradient pulse during its application between said 90° and 180° RF pulses and its application between the first 180° RF pulse and the midpoint of the time interval between the first and second 180° pulses are substantially the same.

24. The method of claim 23 wherein said projections are obtained by reorienting said third imaging magnetic field gradient within the plane of said selected slab so as to span at least an arc of 180°.

25. A method of generating NMR image data using multiple spin echo pulse sequences and two-dimensional Fourier transform projections for producing images having an improved signal to noise ratio, comprising:
(a) selectively exciting nuclear spins within a planar slab within a sample and applying a programmable amplitude, imaging gradient magnetic field pulse along a first axis directed coplanarly with said slab, and thereafter applying a series of 180° nonselective pulses to said sample at spaced time intervals to produce a corresponding series of m spin echo signals in the intervals following said 180° pulses, each spin echo having an associated signal to noise ratio;
(b) said selecting, and each of said applying steps being repeatedly performed for a succession of projections and said programmable imaging gradient being distinct for each of said successive projections and said intervals containing a predetermined imaging magnetic field gradient along a second axis directed coplanarly with said slab and substantially orthogonally to said first axis for all of said successive projections;
(c) converting of each of said series of m spin echo signals in step (a) into a time series of values and averaging temporally corresponding points of said time series to produce an average time series of values representative of all said spin echoes, whereby said signal to noise ratio is improved by a factor related to the square root of the number m of distinct spin echoes in said series of spin echo signals;
(d) transforming said average time series of values derived from said m spin echo signals, by means of two-dimensional Fourier transforms into frequency domain data representative of average NMR signal data for predetermined spatial locations within said sample and storing said frequency domain data as a modified NMR image.

26. The method of claim 25 wherein said 180° series of pulses are of alternating phase, and said converting step further includes selectively inverting the time sequence of alternating ones of said time series of values.

27. The method of claim 26 wherein said processed data is displayed in the form of changes in intensity or chrominance corresponding to said averaged NMR spin density data.

28. The method of claim 25 wherein said selective excitation of said planar slab comprises application of a 90° RF pulse in the presence of a first imaging magnetic field gradient pulse directed substantially perpendicular to the plane of said slab.

29. The method of claim 28 wherein said selective excitation pulse comprises a gaussian shape modulated RF carrier at the NMR frequency.

30. The method of claim 28 wherein said selective excitation pulse comprises a sinc(bt) shape modulated RF carrier at the NMR frequency.

31. The method of claim 25 wherein said selective excitation is followed by application of a second imaging magnetic field gradient pulse directed opposite to said first imaging magnetic field gradient, for a duration sufficient to rephase previously dephased nuclear spins lying within said planar slab.

32. The method of claims 31 wherein said predetermined imaging magnetic field gradient is substantially constant with respect to time during production of said spin echo signals.

33. The method of claim 32 wherein magnetic field pulse is applied between the applications of said selective excitations and said first 180° RF pulse with a direction substantially the same as said predetermined imaging magnetic field gradient and with amplitude such that the integral of said third gradient magnetic field pulse, with respect to time, is substantially the same as the integral of said pulse, with respect to time, of said predetermined imaging magnetic field gradient pulse from immediately following said 180° pulse to the time midpoint between the first and second 180° RF pulses.

34. A method of generating NMR image data using multiple spin echo pulse sequences and two-dimensional Fourier transform projections for producing images having an improved signal to noise ratio and reflecting substantially the transverse relaxation parameter $T_2$ comprising:
  (a) selectively exciting nuclear spins within a planar slab of a sample and applying a series of 180° nonselective pulses to said sample at spaced time intervals to produce a corresponding series of m spin echo signals in the intervals following said pulses, each spin echo having an associated signal to noise ratio;
  (b) said selecting and applying steps being repeatedly performed for a succession of projections with distinct imaging gradients being employed for each of said succession of projections;
  (c) converting at least two of said series of spin echo signals respectively into at least two other time series of values and averaging temporally corresponding points of said at least two time series to produce a first average time series of values, whereby said signal to noise ratio is improved by a factor related to the square root of the number m of spin echoes converted;
  (d) converting at least two other of said series of spin echo signals respectively into at least two other time series of values and averaging temporally corresponding points of said at least two other time series to produce a second average time series of values having a signal to noise ratio improved by a factor related to the square root of the number of spin echoes converted;
  (e) transforming said first and second average time series into first and second frequency domain data representative of NMR spin density data for the same predetermined spatial projections through said slab and storing said frequency domain data;
  (f) reconstructing said first stored frequency domain data from successive projections into modified data representative of the first averaged spin density data at particular locations in said slab and storing said modified data as individual elements of a first array corresponding to said particular slab locations;
  (g) reconstructing said second stored frequency domain data from successive projections into modified data representative of the second averaged spin density data at particular locations in said slab and storing said modified data as individual elements of a second array corresponding to said particular slab locations, wherein corresponding individual elements of said first and second arrays relate to the same particular slab location; and
  (h) determining a transverse relaxation time value for each of said particular slab locations using said first and second averaged spin density data and storing the resulting $T_2$ values in an array of locations corresponding to particular slab locations.

35. The method of claim 34 wherein said series of 180° pulses are of alternating phase and said converting steps further include reversing the time sequence of alternating ones of said first and second time series of values.

36. The method of claim 34 wherein said array of locations of $T_2$ values is presented on display means and configured to facilitate visual interpretation thereof as changes in intensity corresponding to said $T_2$ values.

37. The method of claim 34 wherein said array of locations of $T_2$ values is presented to display means and configured to facilitate visual interpretation thereof as changes in intensity or chorminance corresponding to said $T_2$ values.

38. The method of claim 34 wherein said array of locations of $T_2$ values is presented to a display means and configured to facilitate visual interpretation thereof as printed arrays of particular alphanumeric symbols corresponding to said $T_2$ values.

39. The method of claim 34 wherein said selective excitation of said planar slab comprises application of a 90° RF pulse in the presence of a first imaging magnetic field gradient pulse directed substantially perpendicular to the plane of said slab.

40. The method of claim 39 wherein said selective excitation pulse comprises a gaussian shape modulated RF carrier at the NMR frequency.

41. The method of claim 39 wherein said selective excitation pulse comprises a sinc(bt) shape modulated RF carrier at the NMR frequency.

42. The method of claims 34 wherein said selective excitation is followed by application of a second imaging magnetic field gradient pulse directed opposite to said first imaging magnetic field gradient, for a duration sufficient to rephase previously dephased nuclear spins lying within said planar slab.

43. The method of claim 34 wherein a third imaging magnetic field gradient directed substantially orthogonally to said first magnetic field gradient and lying in the plane of said selected slab is applied as a series of pulses between the application of said 90° pulse and said 180° RF pulses, and between successive 180° RF pulses.

44. The method of claim 43 wherein said third imaging magnetic field gradient is substantially constant with respect to time during production of said spin echo signal.

45. The method of claim 44 wherein the integrals with respect to time of said third imaging magnetic field gradient pulse during its application between said 90° and 180° RF pulses and its application between the first 180° RF pulse and the midpoint of the time interval between the first and second 180° pulses are substantially the same.

46. The method of claim 45 wherein said projections are obtained by applying a fourth imaging magnetic field gradient directed orthogonally to said first imaging magnetic field gradient and said third imaging magnetic field gradient, during the interval between said 90° pulse and said first 180° pulse, whereby said fourth imaging gradient pulse has a programmable amplitude which is varied.

* * * * *